United States Patent [19]
Ishihara

[11] Patent Number: 6,054,883
[45] Date of Patent: Apr. 25, 2000

[54] HIGH ACCURACY 90° PHASE SHIFT CIRCUIT ERROR DETECTION

[75] Inventor: Hisaya Ishihara, Kanagawa, Japan

[73] Assignee: NEC Corporation, Tokyo, Japan

[21] Appl. No.: 09/104,107

[22] Filed: Jun. 25, 1998

[30] Foreign Application Priority Data

Jun. 26, 1997 [JP] Japan ................................. 9-170402

[51] Int. Cl.⁷ .................................................. H03K 5/13
[52] U.S. Cl. ......................... 327/255; 327/240; 327/249; 327/253; 375/261
[58] Field of Search .................................. 327/231–233, 327/236, 237, 238–240, 243–245, 248, 249, 250–255; 375/260, 261

[56] References Cited

U.S. PATENT DOCUMENTS

| | | | |
|---|---|---|---|
| 4,109,102 | 8/1978 | Yoshida et al. | 375/332 |
| 5,886,584 | 3/1999 | Tanai et al. | 332/103 |

FOREIGN PATENT DOCUMENTS

| | | |
|---|---|---|
| 5-110369 | 4/1993 | Japan . |
| 5110369 | 4/1993 | Japan . |
| 6-283966 | 10/1994 | Japan . |
| 7-303028 | 11/1995 | Japan . |
| 8-18397 | 1/1996 | Japan . |

*Primary Examiner*—Timothy P. Callahan
*Assistant Examiner*—Minh Nguyen

[57] ABSTRACT

A phase shift circuit includes a CR phase shifter for receiving an input signal to output a pair of first signals having a 90° phase difference therebetween, a pair of variable-gain amplifiers for receiving the first signals to output a pair of second signals, an adder for adding both the second signals to output a sum signal, a subtracter for outputting a difference signal between the second signals, and a phase error detector for detecting the phase difference between the outputs from the adder and the subtracter to output a pair of gain control signal based on the phase difference. The gain control signal is fed-back to the variable-gain amplifier to control the ratio between the gains of the variable-gain amplifiers.

6 Claims, 4 Drawing Sheets

HIGH ACCURACY 90° PHASE SHIFT CIRCUIT ERROR DETECTION

BACKGROUND OF THE INVENTION

(a) Field of the Invention

The present invention relates to a phase shift circuit and, more particularly, to a 90° phase shift circuit for use in quadrature modulation/demodulation in communication systems.

(b) Description of the Related Art

A phase shift circuit for generating a pair of carrier waves having a 90° phase difference therebetween is generally used in a quadrature modulator/demodulator in communication systems. An example of the phase shift circuits is described in JP-A-5-110369. Referring to FIG. 1 showing the described phase shift circuit, the phase shift circuit comprises an CR-RC phase shifter PS1 for receiving an input signal through an input terminal 15 to deliver a pair of output signals 11 and 12 having a 90° phase difference therebetween, first and second amplitude equalizers EQ18 and EQ19 for clipping the amplitudes of the pair of signals 11 and 12, respectively, to deliver amplitude-equalized signals 181 and 191, a first subtracter SU4 and first adder AD5 for receiving output signals 181 and 191 from the amplitude equalizers EQ18 and EQ19 to deliver a first difference signal 41 and a first sum signal 51, respectively, third and fourth amplitude equalizers EQ20 and EQ21 for clipping the amplitudes of the first difference signal 41 and the first sum signal 51, respectively, to output amplitude-equalized signals 201 and 211, respectively, a second subtracter SU9 and a second adder AD10 for receiving amplitude-equalized signals 201 and 211, respectively, to deliver a second difference signal 91 through output terminal 16 and a second sum signal 101 through output terminal 17, respectively. The output signals 91 and 101 have a 90° phase difference and an equal amplitude, whereby the output signals 91 and 101 are generally used as a pair of carrier waves in a quadrature modulator/demodulator in a communication system.

In the phase shift circuit of FIG. 1, amplitude-equalized signals 181 and 191 delivered from the amplitude equalizers EQ18 and EQ19 can be generally represented by $2\cos(\omega t + \Delta\Phi)$ and $2\cos(\omega t - \Delta\Phi)$, respectively, with the phase difference therebetween being $2\Delta\Phi$. Thus, sum signal ($S_{51}$) 51 and difference signal ($D_{41}$) 41 output from the first adder AD5 and the first subtracter SU4 are expressed by:

$$S_{51} = 2\cos(\omega t + \Delta\phi) + 2\cos(\omega t - \Delta\phi) \quad (1)$$
$$= 4\cos(\Delta\phi) \cdot \cos\omega t$$

$$D_{41} = 2\cos(\omega t + \Delta\phi) - 2\cos(\omega t - \Delta\phi) \quad (2)$$
$$= -4\sin(\Delta\phi) \cdot \sin\omega t.$$

Comparing expressions (1) and (2), it is understood that the phase difference between the difference signal 41 from the subtracter 4 and the sum signal 51 from the adder 5 is exactly 90°, and that the ratio between both the amplitudes is expressed by:

$$sin(\Delta\Phi)/cos(\Delta\Phi) = tan(\Delta\Phi) \quad (3).$$

From the above description, it will be understood that the first subtracter SU4 and the first adder AD5 substantially act as phase/amplitude converters, the outputs of which have a phase difference of 90° therebetween. Thus, after the difference signal 41 and the sum signal 51 are subjected to amplitude equalization by the amplitude equalizers EQ20 and EQ21 and further subtraction and addition by the second subtracter SU9 and the second adder AD10, respectively, a pair of carrier signals 91 and 101 can be obtained theoretically having an exact phase difference of 90° therebetween and an equal amplitude.

However, in the conventional phase shift circuit as described above, if the signal lines transmitting the signals 181, 191, 201 and 211 from the amplitude equalizers EQ18, EQ19, EQ20 and EQ21 have significant parasitic capacitances and parasitic resistances, the outputs of each pair of amplitude equalizers have a phase error therebetween. The phase error cannot be eliminated even after iterated combinations of addition/subtraction and amplitude equalization.

Especially, in the case of a high frequency input signal, the parasitic capacitance and the parasitic resistance have more significant influences upon the output signals and thereby degrade the modulation and/or demodulation in communications systems using the carrier signals output from the conventional phase shift circuit.

SUMMARY OF THE INVENTION

It is therefore an object of the present invention to provide a phase shift circuit for use in modulation/demodulation in a communication system, which is capable of outputting a pair of carrier signals having a substantially correct phase difference of 90° therebetween and a substantially equal amplitude, especially in a high frequency range of the input signal.

The present invention provides a phase shift circuit comprising a phase shifter for receiving an input signal to output a pair of first signals having a first phase difference therebetween, a pair of variable-gain amplifiers for receiving the pair of first signals, respectively, to output a pair of second signals, respectively, an adder for receiving the pair of second signals to output a sum signal, a subtracter for receiving the pair of second signals to output a difference signal, a pair of amplitude equalizers for receiving the sum signal and the difference signal, respectively, to output an amplitude-limited sum signal and an amplitude-limited difference signal, respectively, the amplitude-limited sum signal and the amplitude-limited difference signal having substantially an equal amplitude, and a phase error detector for detecting a phase difference between the amplitude-limited sum signal and the amplitude-limited difference signal to output a pair of gain control signals based on the phase difference, the gain control signals controlling the ratio between gains of the pair of variable-gain amplifiers.

Alternatively, the order of the phase shifter and the pair of variable-gain amplifiers may be reversed in the above configuration.

In accordance with the phase shift circuit of the present invention, the phase difference caused by the amplitude equalizers can be eliminated by the feed-back scheme of the phase shift circuit, wherein the gain control signals based on the phase error between the outputs of the phase equalizers are fed-back to the variable-gain amplifiers to eliminate the phase error, whereby a pair of output signals having an accurate phase difference therebetween can be obtained.

The above and other objects, features and advantages of the present invention will be more apparent from the following description, referring to the accompanying drawings.

PREFERRED EMBODIMENTS OF THE INVENTION

Figure 1:
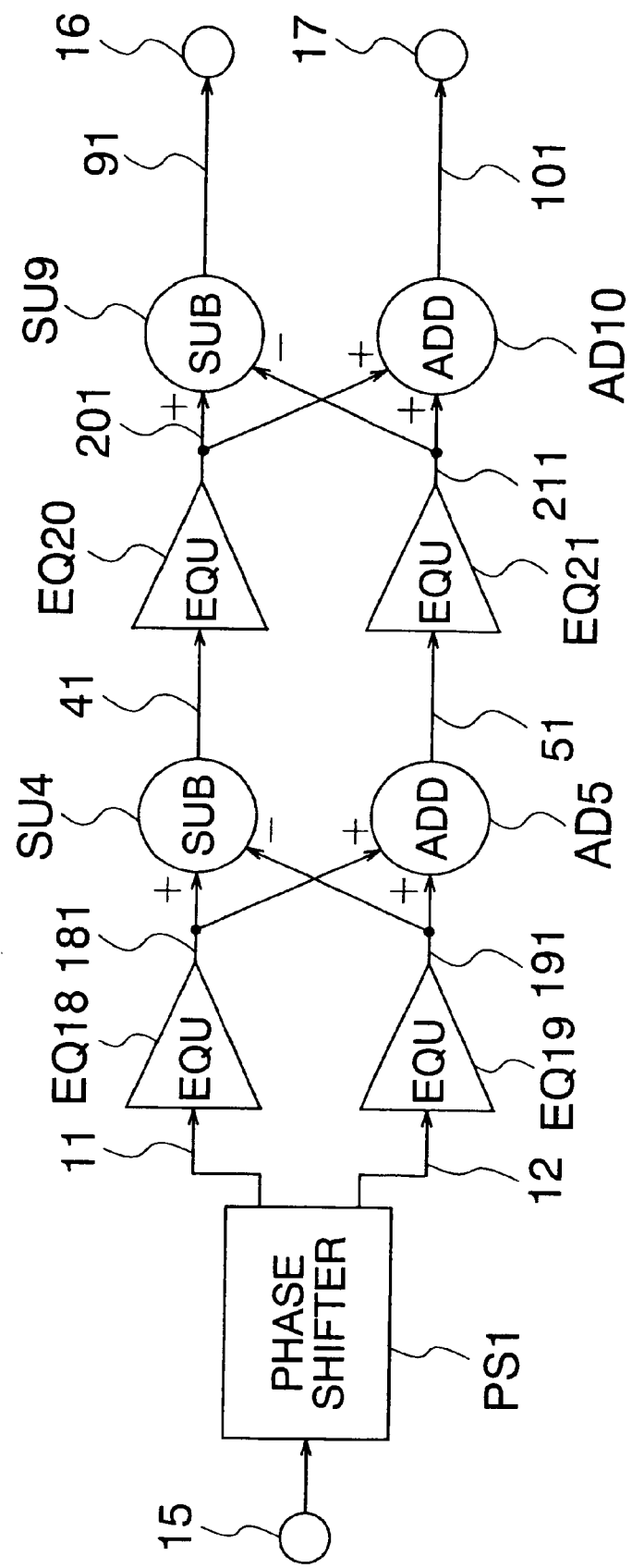
FIG. 1 is a block diagram of a conventional phase shift circuit.

Now, the present invention is more specifically described with reference to accompanying drawings, wherein similar constituent elements are designated by the same or similar reference numerals throughout the drawings.

Figure 2:
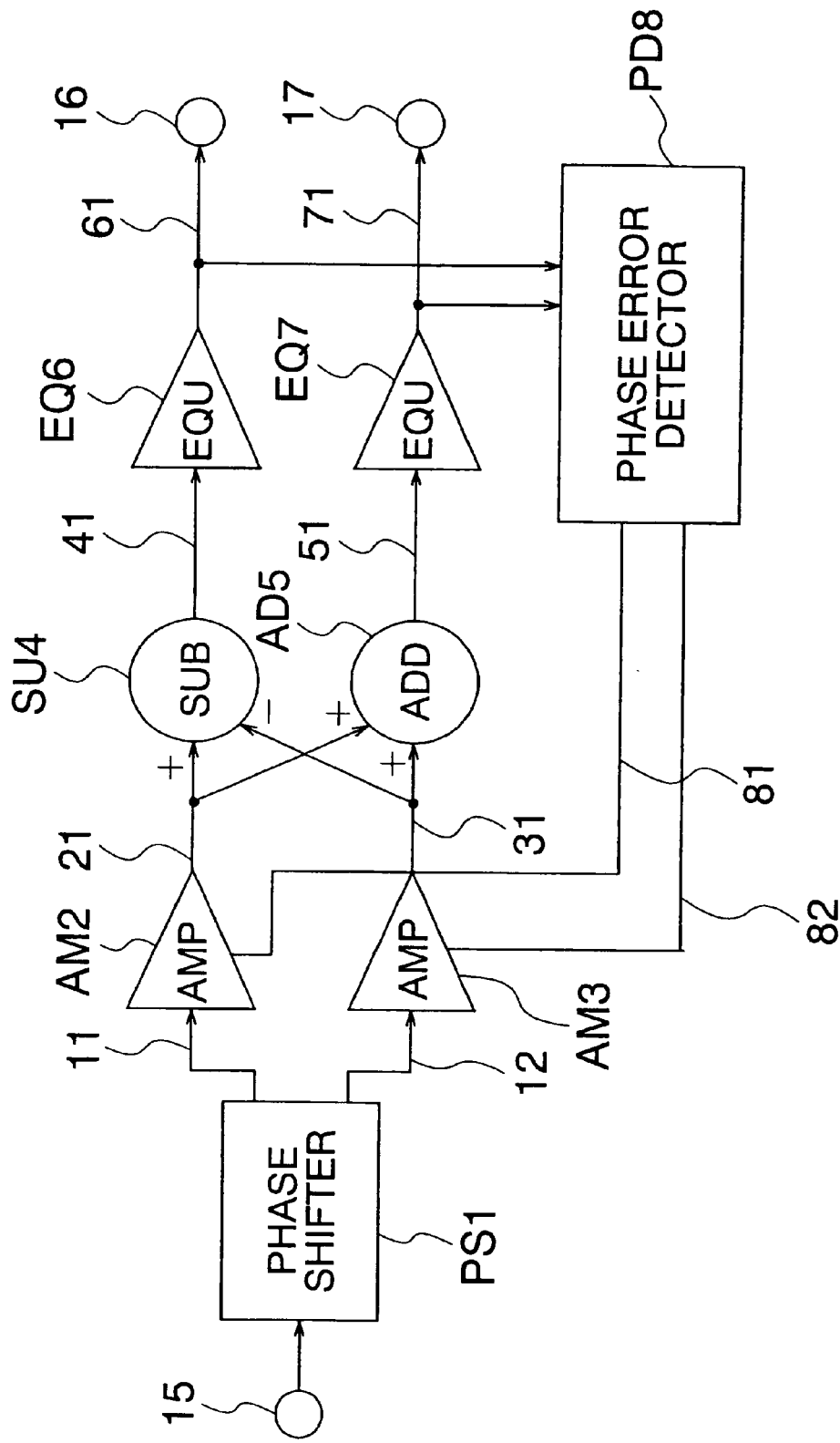
FIG. 2 is a block diagram of a phase shift circuit according to a first embodiment of the present invention.

Referring to FIG. 2, a phase shift circuit according to a first embodiment of the present invention comprises an CR-RC phase shifter PSI for receiving an input signal through an input terminal 15 to deliver a pair of output signals 11 and 12 having a substantially 900 phase difference therebetween and a substantially equal amplitude, first and second variable-gain amplifiers AM2 and AM3 for amplifying the pair of signals 11 and 12, respectively, with variable gains controlled by gain control signals 81 and 82 to deliver amplified signals 21 and 31, respectively, a pair of subtracter SU4 and adder AD5 for receiving the amplified signals 21 and 31, respectively, from the amplifiers AM2 and AM3 to deliver a difference signal 41 and a sum signal 51, respectively, first and second amplitude equalizers EQ6 and EQ7 for clipping the amplitudes of the difference signal 41 and the sum signal 51, respectively, to output amplitude-equalized signals 61 and 71 through output terminals 16 and 17, respectively, and a phase error detector PD8 for detecting a phase difference or phase error between the amplitude-equalized signals 61 and 71, to output the gain control signals 81 and 82 based on the phase error between the output signals 61 and 71 to the variable-gain amplifiers AM2 and AM3. The input signal may be an output from a local oscillator.

Phase shifter PS1 may be implemented by a CR-RC phase shifter pair comprising a first CR circuit having a first capacitor inserted between the input 15 and the first output 11 of the phase shifter PSI and a first resistor connected between the first output 11 and the ground, and a second CR circuit having a second resistor inserted between the input 15 and the second output 12 of the phase shifter PS1 and a second capacitor connected between the second output 12 and the ground. The amplitude equalizers EQ6 and EQ7 may be implemented by a pair of nonlinear amplifiers having equal characteristics to clip the amplitudes of the difference signal 41 and the sum signal 51, respectively.

It is assumed in the phase shift circuit of the present embodiment that the pair of output signals 11 and 12 from the phase shifter PS1 are expressed by a·cosωt and sin(ωt+ΔΦ), wherein "a" represents amplitude ratio between the signals 11 and 12 and ΔΦ is a phase error deviated from 90° in the phase difference between the signals 11 and 12. The sum signal 51 ($S_{51}$) output from the adder AD5 is expressed by:

$$S_{51} = ka \cdot \cos\omega t + \sin(\omega t + \Delta\phi) \quad (4)$$

$$= ka \cdot \cos\omega t + \sin\omega t \cdot \cos(\Delta\phi) + \cos\omega t \cdot \sin(\Delta\phi)$$

$$= \{ka + \sin(\Delta\phi)\} \cdot \cos\omega t + \cos(\Delta\phi) \cdot \sin\omega t$$

$$= [\cos^2(\Delta\phi) + \{ka + \sin(\Delta\phi)\}^2]^{1/2} \cdot \sin(\omega t + \phi_A),$$

wherein "k" represents the ratio between the gains by the variable-gain amplifiers AM2 and AM3, and $$tan\Phi_A = ka/\cos(\Delta\Phi) + tan(\Delta\Phi)$$

Similarly, the difference signal 41 ($D_{41}$) from the subtracter SU4 is expressed by:

$$D_{41} = ka \cdot \cos\omega t - \sin(\omega t + \Delta\phi) \quad (5)$$

$$= ka \cdot \cos\omega t - \sin\omega t \cdot \cos(\Delta\phi) - \cos\omega t \cdot \sin(\Delta\phi)$$

$$= \{ka - \sin(\Delta\phi)\} \cdot \cos\omega t - \cos(\Delta\phi) \cdot \sin\omega t$$

$$= [\cos^2(\Delta\phi) + \{ka - \sin(\Delta\phi)\}^2]^{1/2} \cdot \sin(\omega t + \phi_S),$$

wherein $tan\Phi_s = -ka/\cos(\Delta\Phi) + tan(\Delta\Phi)$.

Phase difference Φ between the sum signal 51 and the difference signal 41 is expressed by:

$$\Phi = \Phi_A - \Phi_S = tan^{-1}\{ka/\cos(\Delta\Phi) + tan(\Delta\Phi)\} - tan^{-1}\{-ka/\cos(\Delta\Phi) + tan(\Delta\Phi)\} \quad (6)$$

The ratio (ΔV) between the amplitudes of the sum signal 51 and the difference signal 41 is expressed by:

$$\Delta V = [\cos^2(\Delta\Phi) + \{ka + \sin(\Delta\Phi)\}^2]^{1/2} / [\cos^2(\Delta\Phi) + \{ka - \sin(\Delta\Phi)\}^2]^{1/2} \quad (7)$$

Figure 3:
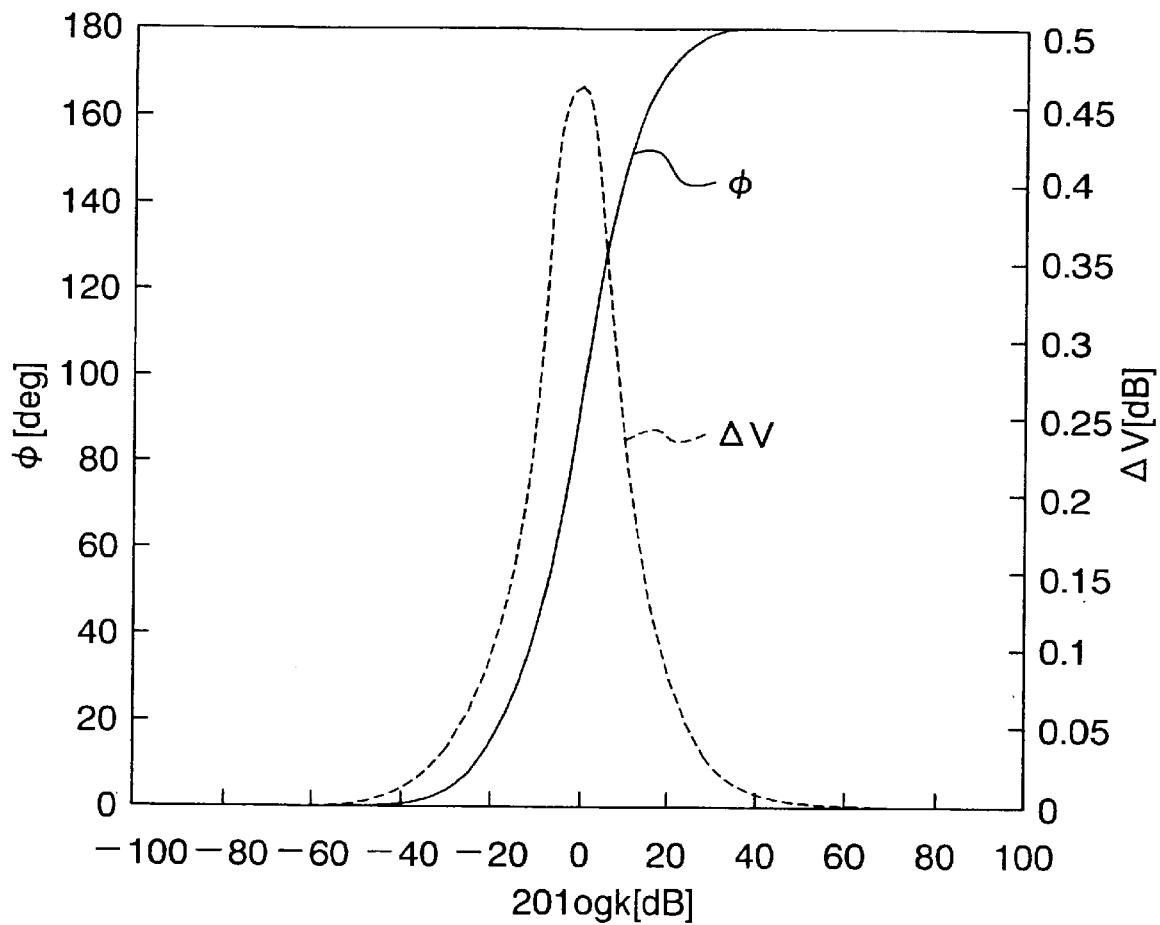
FIG. 3 is a graph for showing amplitude ratio dependency of phase difference and amplitude ratio between the output signals in the phase shift circuit of FIG. 2.

FIG. 3 shows gain ratio (k) dependency of the phase difference Φ (degrees) and amplitude ratio ΔV (dB), wherein 20l ogk (dB) is plotted on abscissa and both phase difference (Φ) in degrees and amplitude ratio (ΔV) in decibel are plotted on ordinate. In this figure, it is assumed as a matter of convenience that a=1.2, and ΔΦ=0.052 (or 3 degrees).

In the phase shift circuit of FIG. 2, the phase error detector PD8 detects phase difference (Φ) between the outputs 61 and 71 from the equalizers EQ6 and EQ7 which clip the amplitude of the output 51 from the adder AD5 and the amplitude of the output 41 from the subtracter SU4 to equalize the amplitudes of the signals 61 and 71. The detected phase difference (Φ) is converted to amplitude control signals 81 and 82 having a ratio of "k" therebetween, which is specified by the graph in FIG. 2. The amplitude control signals 81 and 82 are fed-back to the variable gain amplifiers AM2 and AM3, wherein the gains for the amplification are controlled based on the amplitude control signals 81 and 82 to obtain output signals 61 and 71 having an accurate phase difference of 90° therebetween.

In the present embodiment, if the outputs from the amplitude equalizers EQ6 and EQ7 have therebetween a phase error deviated from 90° due to the parasitic capacitances and parasitic resistances of the output signal lines of the equalizers EQ6 and EQ7, the amplitude control signals 81 and 82 fed-back to the variable-gain amplifiers AM2 and AM3 include a component caused by the phase error; and accordingly, allows the phase shift circuit of the present embodiment to output a pair of output signals 61 and 71 having a correct phase difference of 90° therebetween and an equal amplitude.

Figure 4:
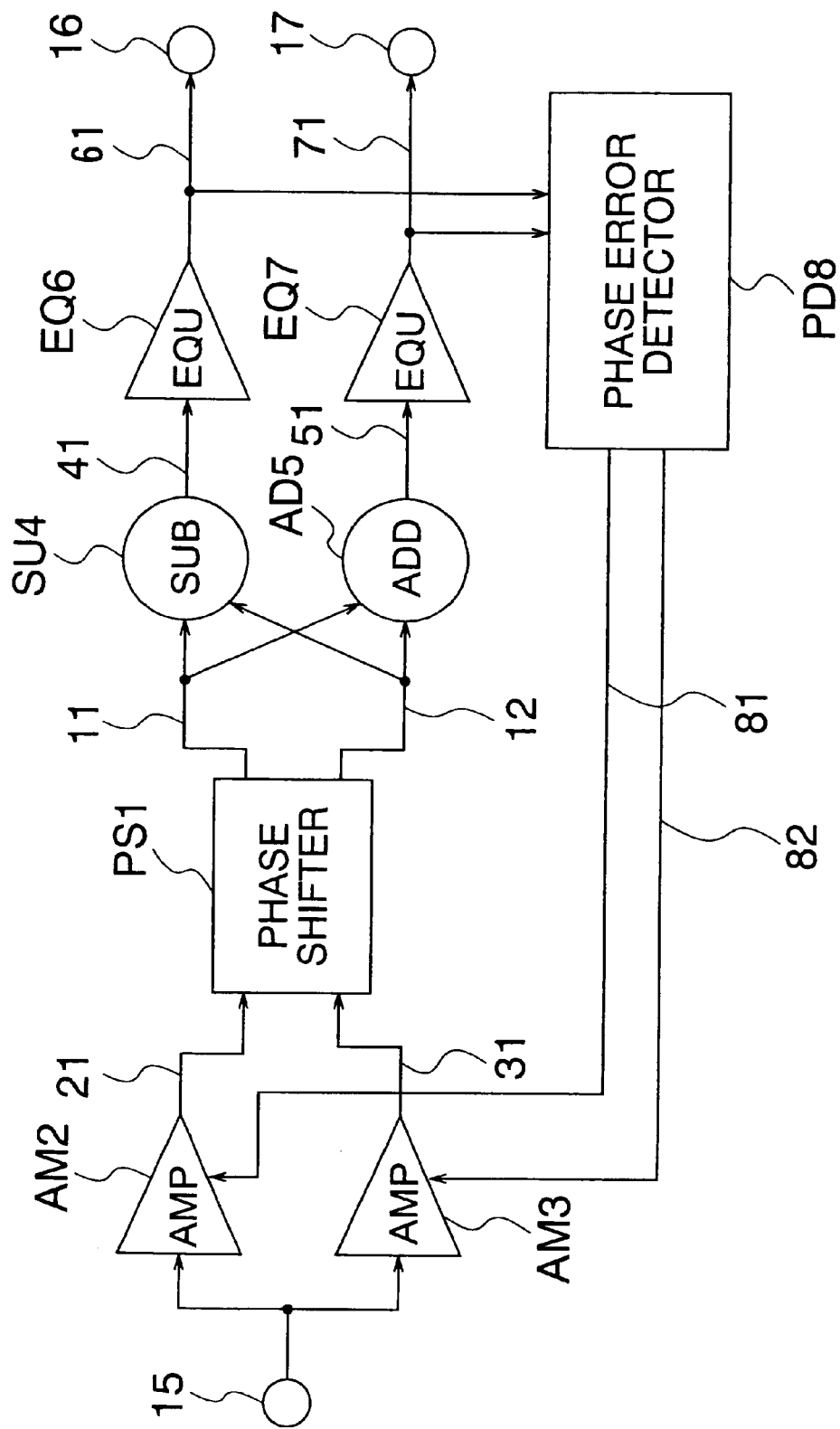
FIG. 4 is a block diagram of a phase shift circuit according to a second embodiment of the present invention.

Referring to FIG. 4, a phase shift circuit according to a second embodiment of the present invention is similar to the first embodiment except that a pair of variable-gain amplifiers AM2 and AM3 receiving the gain control signals 81 and 82 from the phase error detector PD8 are disposed for receiving the input signal through the input terminal 15 to deliver the amplified signals to the CR-RC phase shifter PS1 including a pair of CR phase shift elements, wherein the amplified signals 21 and 31 are subjected to phase shift to have a phase difference of 90° therebetween. The outputs 11 and 12 of the phase shifter PS1 are delivered to the adder AD5 and the subtracter SU4. Other configuration of the present embodiment is similar to the configuration of the first embodiment.

The sum signal ($S_{51}$) 51 output from the adder AD5 and the difference signal ($D_{41}$) 41 output from the subtracter SU4 are expressed by:

$$S_{51} = [\cos^2(\Delta\Phi) + \{ka + \sin(\Delta\Phi)\}^2]^{1/2} \cdot \sin(\omega t + \Phi_A),$$

and $$D_{41} = [\cos^2(\Delta\Phi) + \{ka - \sin(\Delta\Phi)\}^2]^{1/2} \cdot \sin(\omega t + \Phi_S).$$

Thus, the phase difference ($\Phi$) between the sum signal 51 and the difference signal 41 and phase ratio $\Delta V$ are expressed by:

$$\Phi = \tan^{-1}\{ka/\cos(\Delta\Phi) + \tan(\Delta\Phi)\} - \tan^{-1}\{-ka/\cos(\Delta\Phi) + \tan(\Delta\Phi),$$

and $$\Delta V = [\cos^2(\Delta\Phi) + \{ka + \sin(\Delta\Phi)\}^2]^{1/2} / [\cos^2(\Delta\Phi) + \{ka - \sin(\Delta\Phi)\}^2]^{1/2}.$$

According to the phase shift circuit of the present invention, the amplitude error can be corrected by provision of the variable-gain amplifiers receiving the gain control signals generated based on the phase difference between the output carrier signals. The phase shift circuit is preferably used for obtaining a pair of high frequency carrier signals in a communication system.

Since the above embodiments are described only for examples, the present invention is not limited to the above embodiments and various modifications or alterations can be easily made therefrom by those skilled in the art without departing from the scope of the present invention.

What is claimed is:

1. A phase shift circuit comprising a phase shifter for receiving an input signal to output a pair of first signals having a first phase difference therebetween, a pair of variable-gain amplifiers for receiving said pair of first signals, respectively, to output a pair of second signals, respectively, an adder for receiving said pair of second signals to output a sum signal, a subtracter for receiving said pair of second signals to output a difference signal, a pair of amplitude equalizers for receiving said sum signal and said difference signal, respectively, to output an amplitude-limited sum signal and an amplitude-limited difference signal, respectively, said amplitude-limited sum signal and said amplitude-limited difference signal having substantially an equal amplitude, and a phase error detector for detecting a phase difference between said amplitude-limited sum signal and said amplitude-limited difference signal to output a pair of gain control signals based on said phase difference, said gain control signals controlling the ratio between gains of said pair of variable-gain amplifiers.

2. A phase shift circuit as defined in claim 1, wherein said first phase difference is substantially 90°.

3. A phase shift circuit as defined in claim 1, wherein said phase shifter is implemented by a pair of CR phase shifting elements.

4. A phase shift circuit comprising a pair of variable-gain amplifiers for receiving a common input signal to output a pair of first signals, respectively, a pair of phase shifters for receiving said pair of first signals, respectively, to output a pair of second signals, respectively, said second signals having a first phase difference therebetween, an adder for receiving said pair of second signals to output a sum signal, a subtracter for receiving said pair of second signals to output a difference signal, a pair of amplitude equalizers for receiving said sum signal and said difference signal, respectively, to output an amplitude-limited sum signal and an amplitude-limited difference signal, respectively, said amplitude-limited sum signal and said amplitude-limited difference signal having substantially an equal amplitude, and a phase error detector for detecting a phase difference between said amplitude-limited sum signal and said amplitude-limited difference signal to output a pair of gain control signals based on said phase difference, said gain control signals controlling the ratio between gains of said pair of variable-gain amplifiers.

5. A phase shift circuit as defined in claim 4, wherein said first phase difference is substantially 90°.

6. A phase shift circuit as defined in claim 4, wherein said pair of phase shifters are implemented by a pair of CR phase shifting elements.

* * * * *